(12) United States Patent
Kwak et al.

(10) Patent No.: US 10,770,474 B2
(45) Date of Patent: Sep. 8, 2020

(54) MANUFACTURING METHOD OF SEMICONDUCTOR DEVICE

(71) Applicant: SK hynix Inc., Gyeonggi-do (KR)

(72) Inventors: Sang Hyon Kwak, Seoul (KR); Duk Eui Lee, Seoul (KR); Nam Gyu Kim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 80 days.

(21) Appl. No.: 16/148,416

(22) Filed: Oct. 1, 2018

(65) Prior Publication Data

US 2019/0319041 A1  Oct. 17, 2019

(30) Foreign Application Priority Data

Apr. 12, 2018  (KR) .......................... 10-2018-0042885

(51) Int. Cl.
| | |
|---|---|
| *H01L 21/30* | (2006.01) |
| *H01L 27/11582* | (2017.01) |
| *H01L 29/10* | (2006.01) |
| *H01L 21/768* | (2006.01) |
| *H01L 27/11565* | (2017.01) |
| *H01L 21/311* | (2006.01) |
| *H01L 21/02* | (2006.01) |
| *H01L 21/28* | (2006.01) |

(52) U.S. Cl.
CPC .... *H01L 27/11582* (2013.01); *H01L 21/0223* (2013.01); *H01L 21/31116* (2013.01); *H01L 21/76802* (2013.01); *H01L 21/76877* (2013.01); *H01L 27/11565* (2013.01); *H01L 29/1037* (2013.01); *H01L 29/40117* (2019.08)

(58) Field of Classification Search
None
See application file for complete search history.

(56) References Cited

U.S. PATENT DOCUMENTS

| | | | |
|---|---|---|---|
| 9,613,977 B2 | 4/2017 | Sharangpani et al. | |
| 10,128,086 B1* | 11/2018 | Huang | H01L 21/02238 |
| 2012/0094453 A1* | 4/2012 | Han | H01L 27/11582 |
| | | | 438/269 |
| 2012/0112264 A1* | 5/2012 | Lee | H01L 27/11551 |
| | | | 257/324 |

FOREIGN PATENT DOCUMENTS

| | | |
|---|---|---|
| KR | 101677740 | 11/2016 |
| KR | 1020170119915 | 10/2017 |

* cited by examiner

*Primary Examiner* — Bradley Smith
(74) *Attorney, Agent, or Firm* — IP & T Group LLP

(57) ABSTRACT

A manufacturing method of a semiconductor device includes: forming pillars in a first region of a stack structure in which interlayer insulating layers and sacrificial insulating layers are alternately stacked; forming a slit in a second region of the stack structure; and removing the sacrificial insulating layers in the first region. In the removing of the sacrificial insulating layers in the first region, a portion of each of the sacrificial insulating layers, which is adjacent to the slit, and a portion of each of the sacrificial insulating layers, which is disposed between the pillars, may be removed using different etching materials.

19 Claims, 17 Drawing Sheets

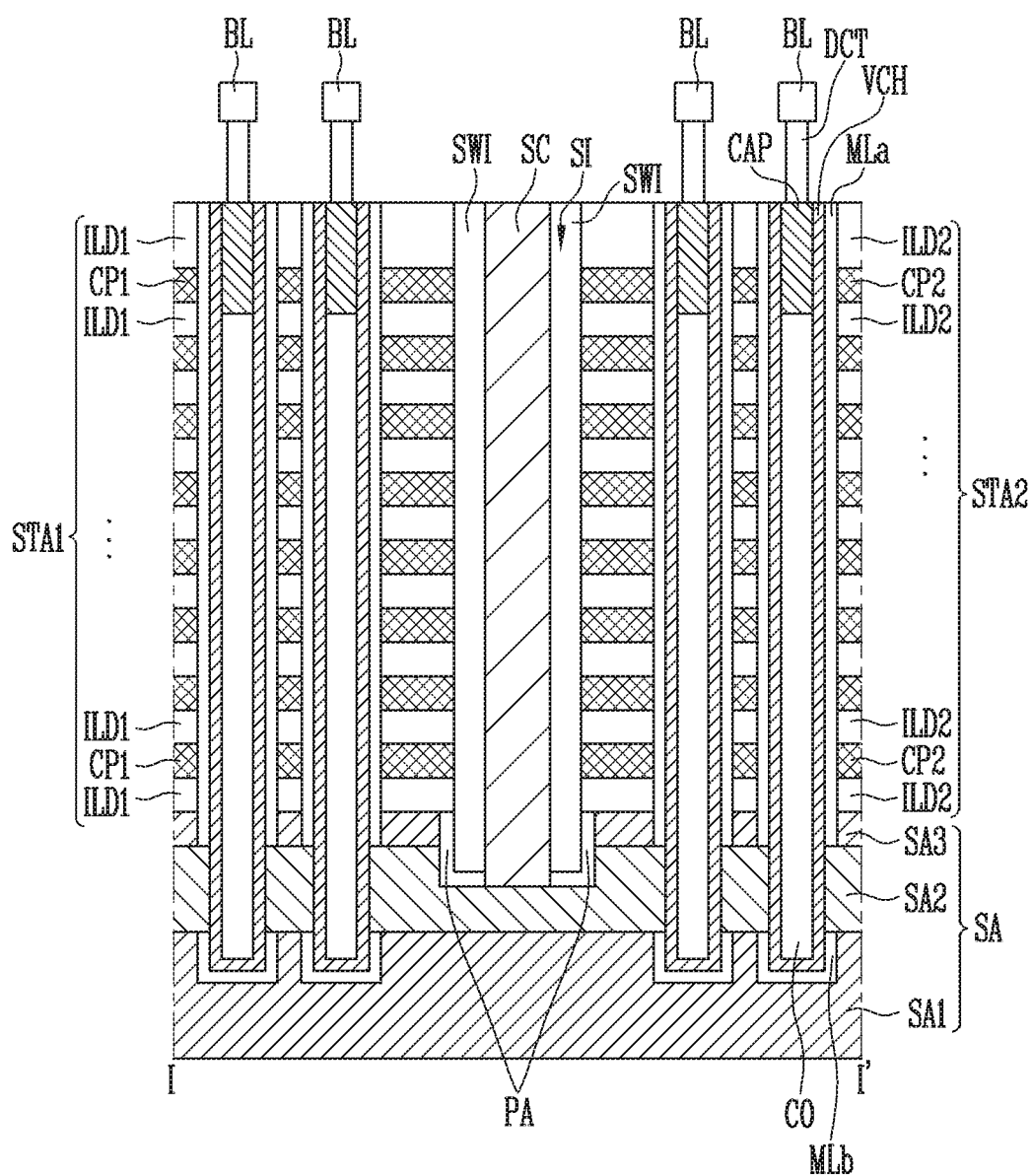

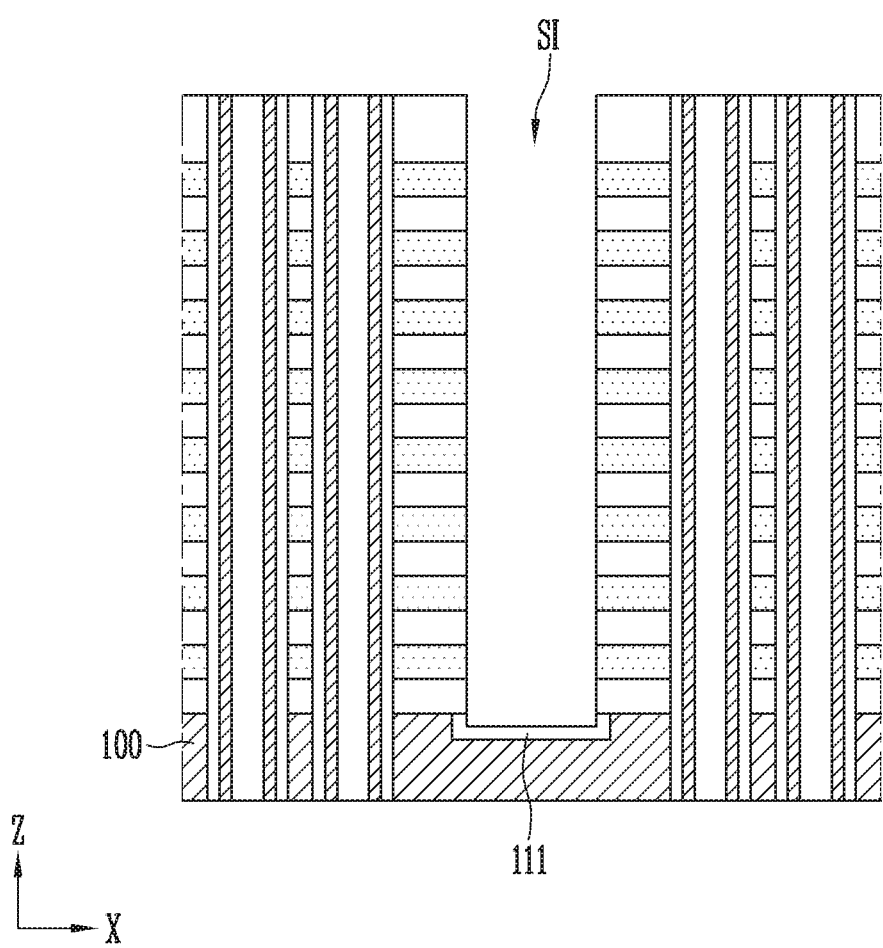

MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2018-0042885, filed on Apr. 12, 2018, the entire disclosure of which is herein incorporated herein by reference in its entirety.

BACKGROUND

1. Field of Invention

The present disclosure generally relates to a semiconductor device and a manufacturing method thereof, and more particularly, to a manufacturing method of a three-dimensional semiconductor device.

2. Description of Related Art

A semiconductor device includes memory cell transistors capable of storing data. A three-dimensional semiconductor device has been proposed for improving the degree of integration of memory cell transistors. The three-dimensional semiconductor device includes memory cell transistors stacked on a substrate to be spaced apart from each other. The three-dimensional semiconductor device includes interlayer insulating layers and conductive patterns, which are alternately stacked on the substrate, a vertical channel penetrating the interlayer insulating layers and the conductive patterns, and a data storage layer disposed between each of the conductive patterns and the vertical channel. The memory cell transistors may be defined at intersection portions of the vertical channel and the conductive patterns.

In order to increase the storage capacity of the three-dimensional semiconductor device, a large number of conductive patterns and a large number of interlayer insulating layers may be stacked. However, as the number of stacked layers of the conductive patterns and the interlayer insulating layers increases, various failures may occur.

SUMMARY

In accordance with an aspect of the present disclosure, there is provided a method of manufacturing a semiconductor device, the method including: forming a stack structure including a first region and a second region by alternately stacking interlayer insulating layers and sacrificial insulating layers on a lower structure; forming pillars penetrating the first region of the stack structure; forming a slit penetrating the second region of the stack structure; forming first openings between the interlayer insulating layers by removing the sacrificial insulating layers remaining between a slit-side pillar adjacent to the slit among the pillars and the slit, using a first etching material introduced through the slit; and forming second openings between the interlayer insulating layers by removing the sacrificial insulating layers remaining between the pillars, using a second etching material different from the first etching material, which is introduced through the first openings.

In accordance with an aspect of the present disclosure, there is provided a method of manufacturing a semiconductor device, the method including: forming a stack structure by alternately stacking interlayer insulating layers and sacrificial insulating layers on a lower structure, the stack structure including first regions spaced apart from one another and a second region disposed between the first regions; forming holes penetrating each of the first regions of the stack structure; forming pillars filling in the holes, the pillars being divided into first and second pillar groups by the second region, each of the first and second pillar groups including a center pillar and a slit-side pillar; forming a slit penetrating the second region to a depth to expose the lower structure; forming a protective layer on the lower structure which is exposed through the slit; removing only a portion of each of the sacrificial insulating layers which remains between the slit and the slit-side pillar through a first selective etching process by introducing a first etching material through the slit to form first openings between adjacent interlayer insulating layers; performing a second etching using a second etching material that is different from the first etching material for removing remaining portions of the sacrificial insulating layers adjacent to the slit which were not removed with the first etching, and the sacrificial insulating layers between the pillars.

BRIEF DESCRIPTION OF THE DRAWINGS

Example embodiments of the invention will now be described more fully hereinafter with reference to the accompanying drawings; however, it is noted that the invention may be embodied in different other forms and should not be construed as limited only to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. Like reference numerals refer to like elements throughout.

FIGS. 3A to 3D are sectional views illustrating various three-dimensional semiconductor devices in accordance with embodiments of the present disclosure.

FIGS. 4A to 4F are sectional views illustrating a manufacturing method of a semiconductor device in accordance with an embodiment of the present disclosure.

DETAILED DESCRIPTION

The technical spirit of the present disclosure may be changed in various manners, and may be implemented as embodiments having various aspects. Hereinafter, the present disclosure will be described by way of some embodiments so that those skilled in the art can easily practice the embodiments of the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

Embodiments provide a manufacturing method of a three-dimensional semiconductor device capable of decreasing a failure rate of the semiconductor device.

Figure 1A:
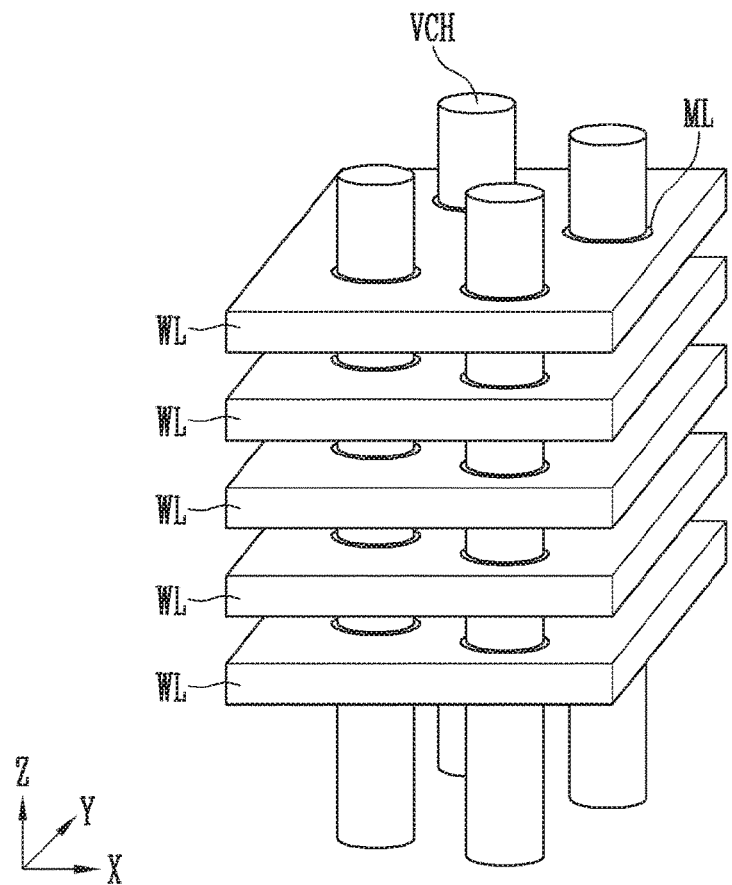
FIGS. 1A and 1B are views schematically illustrating a semiconductor device in accordance with an embodiment of the present disclosure.
Figure 1B:
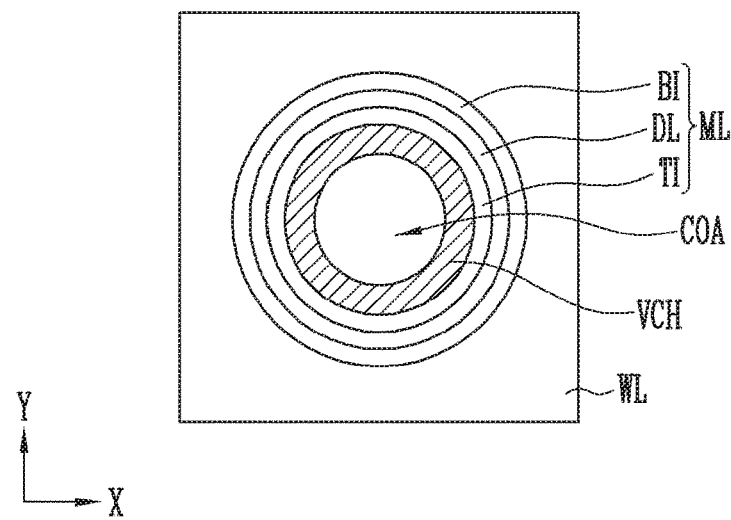

FIGS. 1A and 1B are views schematically illustrating a semiconductor device in accordance with an embodiment of the present disclosure. More specifically, FIG. 1A is a perspective view of the semiconductor device illustrating an arrangement of memory cell transistors. FIG. 1B is a cross-sectional view of a word line illustrating a multi-layer disposed between a vertical channel and the word line, shown in FIG. 1A.

Referring to FIG. 1A, the semiconductor memory device in accordance with an embodiment of the present disclosure may include word lines WL parallel to a horizontal plane extending along first and second directions X and Y intersecting each other. The word lines WL are conductive patterns, and may be spaced apart from each other along a third direction Z vertically intersecting the first and second directions X and Y. Each of the word lines WL may be formed to surround vertical channels VCH. Each of the word lines WL may be used as a gate of a memory cell transistor.

Each of the vertical channels VCH extends in the third direction Z to penetrate the word lines WL. The vertical channels VCH may be disposed in a zigzag arrangement in the first direction X, and in a zigzag in the second direction Y for increasing the arrangement density of the vertical channels VCH and therefore also the arrangement density of the memory cell transistors.

A multi-layer ML including a data storage layer may be disposed between each of the vertical channels VCH and each of the word lines WL. Hereinafter, the multi-layer ML will be described in more detail with reference to FIG. 1B.

Referring to FIG. 1B, the vertical channel VCH may be surrounded by the multi-layer ML. The multi-layer ML may be disposed between the vertical channel VCH and the word line WL. The multi-layer ML may include a tunnel insulating layer TI surrounding the vertical channel VCH, a data storage layer DL surrounding the tunnel insulating layer TI, and a blocking insulating layer BI surrounding the data storage layer DL. The data storage layer DL may store data changed by Fowler-Nordheim tunneling caused by a difference in voltage between the word line WL and the vertical channel VCH. The data storage layer DL may be formed of various suitable materials. For example, the data storage layer DL may be formed of a nitride layer in which charges can be trapped. Alternatively, the data storage layer DL may be made of or include silicon, a phase change material, nanodots, and the like. The blocking insulating layer BI may be made of or include an oxide layer capable of blocking charges. The tunnel insulating layer TI may include a silicon oxide layer through which charge tunneling can be performed.

The vertical channel VCH may be formed as a semiconductor layer. For example, the vertical channel VCH may be formed as a silicon layer. The vertical channel VCH may be formed in a ring shape defining a core region COA. Although not shown in the drawing, the vertical channel VCH may be formed to completely fill in the core region COA. Alternatively, the core region COA may be filled with at least one of an insulating layer and a doped semiconductor layer.

Referring to FIG. 1A, memory cell transistors are formed at intersection portions of the word lines WL and the vertical channels VCH. Gates of a plurality of memory cell transistors arranged in the same plane may be commonly controlled by one of the word lines WL. Each of the vertical channels VCH may be used as a channel of a plurality of memory cell transistors stacked in the third direction Z.

In order to improve the degree of integration of the memory cell transistors, the arrangement density of the vertical channels VCH may be increased. Also, for improving the degree of integration of the memory cell transistors, the number of word lines WL stacked along the third direction Z may be increased.

Figure 2:
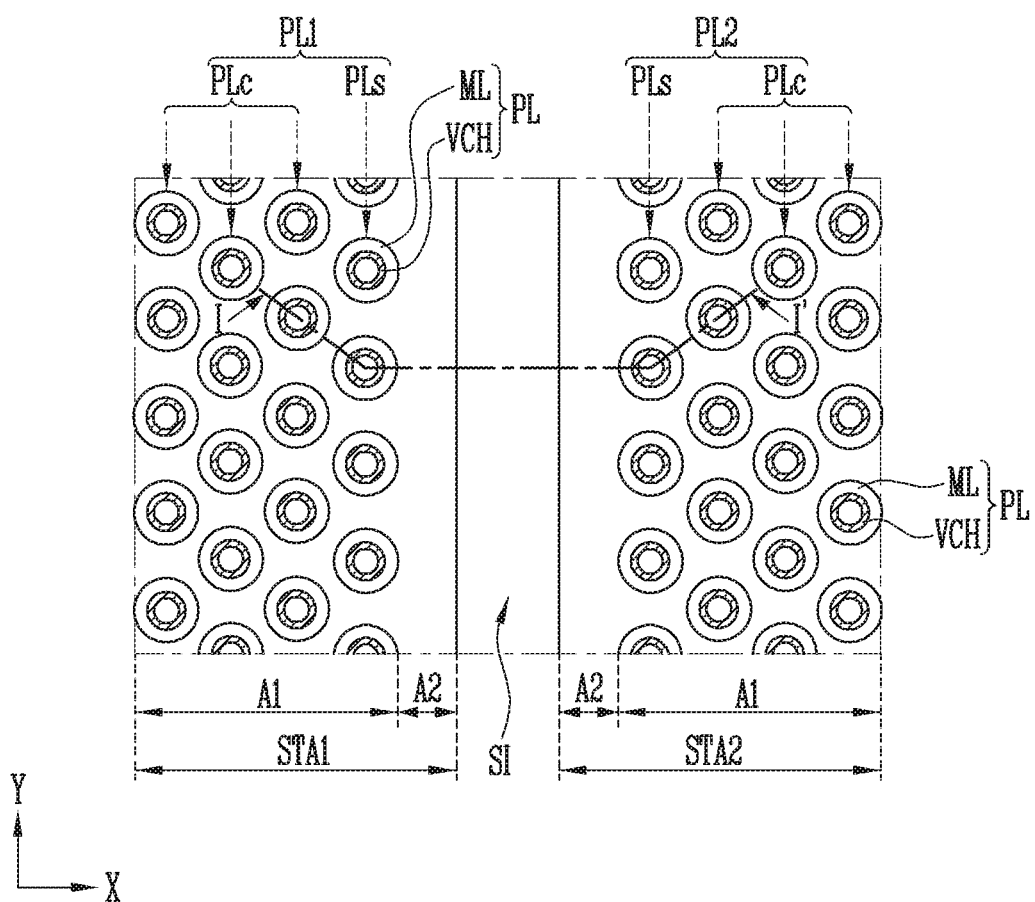
FIG. 2 is a plan view of an arrangement of pillars, in accordance with an embodiment of the present disclosure.

FIG. 2 is a plan view of an arrangement of pillars in accordance with an embodiment of the present disclosure. Each of the pillars PL may include a vertical channel VCH and a multi-layer ML surrounding the vertical channel VCH. Some features of the vertical channel VCH and the multi-layer ML have been described in FIGS. 1A and 1B, and therefore, overlapping descriptions will be omitted.

The pillars PL penetrate stack structures STA1 and STA2 spaced apart from each other through a slit SI. The pillars PL may be divided into pillar groups PL1 and PL2 by the slit SI. In the drawing, only a first stack structure STA1 and the second stack structure STA2 are illustrated, and only a first pillar group PL1 penetrating the first stack structure STA1 and a second pillar group PL2 penetrating the second stack structure STA2 are illustrated. However, the present disclosure is not limited thereto. That is, the stack structures may include a plurality of three or more stack structures separated by a plurality of slits, and pillar groups penetrating the plurality of three or more stack structures may include three or more groups.

The stack structures STA1 and STA2 may be disposed in a first direction X to be spaced apart from each other. The slit SI may extend in a second direction Y between the stack structures STA1 and STA2 adjacent to each other.

Each of the stack structures STA1 and STA2 may include an array region A1 and a side region A2. The array region A1 is a region penetrated by the pillars PL, and the side region A2 is a region that is not penetrated by the pillars PL. The side region A2 is a narrow region adjacent to the slit SI. The side region A2 is extending toward the slit SI from the array region A1.

The pillars PL included in each of the pillar groups PL1 and PL2 may include slit-side pillars PLs and center pillars PLc. The slit-side pillars PLs are adjacent to the slit SI and are arranged in a straight line along the second direction Y.

FIGS. 3A to 3D are sectional views illustrating various three-dimensional semiconductor devices in accordance with embodiments of the present disclosure. A section shown in each of FIGS. 3A to 3D corresponds to that taken along line I-I' of the stack structures STA1 and STA2 shown in FIG. 2. FIGS. 3A to 3D further illustrate various modifications of structures disposed above the stack structures STA1 and STA2 and various modifications of a lower structure disposed under the stack structures STA1 and STA2. Hereinafter, for convenience of description, the stack structures STA1 and STA2 are divided into the first stack structure STA1 and the second stack structure STA2.

Referring to FIGS. 3A to 3D, the first stack structure STA1 includes first interlayer insulating layers ILD1 and first conductive patterns CP1, which are alternately stacked on a lower structure PG or SA. The second stack structure STA2 includes second interlayer insulating layers ILD2 and second conductive patterns CP2, which are alternately stacked on the lower structure PG or SA.

Each of the first and second interlayer insulating layers ILD1 and ILD2 may be formed of any suitable insulating material such as, for example, a silicon oxide layer. Each of the first and second conductive patterns CP1 and CP2 may be formed of any suitable conductive materials such as, for example, a doped silicon layer, a metal layer, a metal silicide layer, and a barrier layer. Each of the first and second conductive patterns CP1 and CP2 may be made of or include two or more kinds of conductive materials.

Figure 3A:
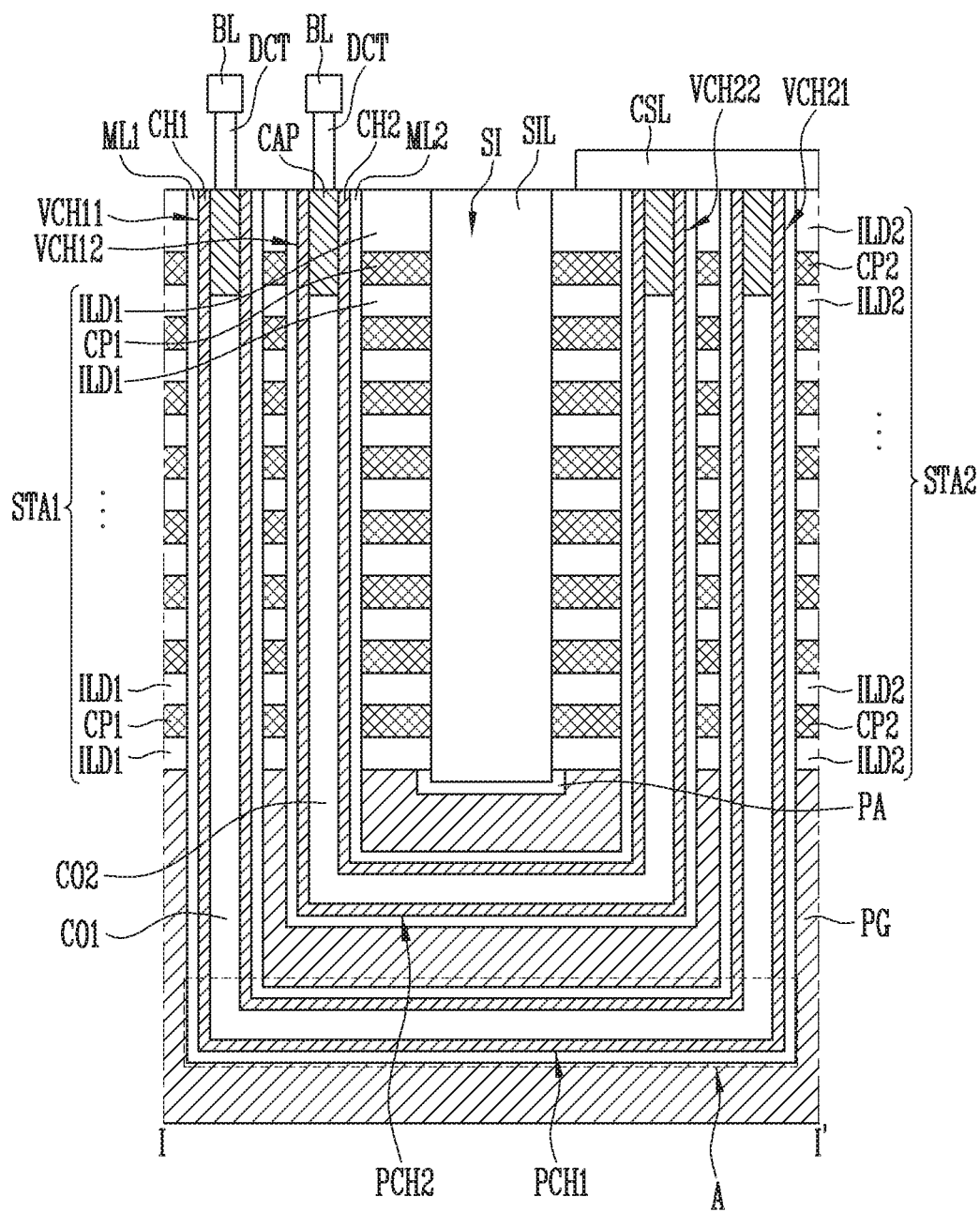
Figure 3B:
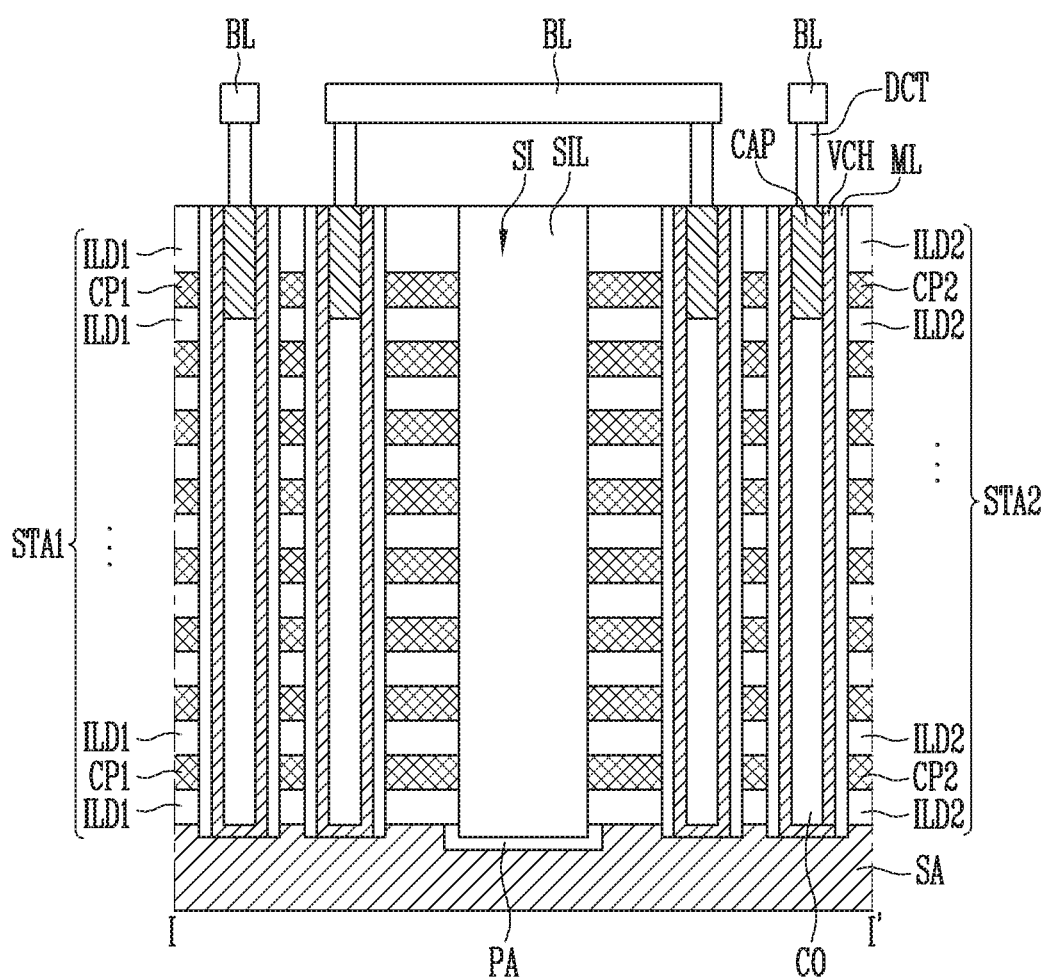
Figure 3D:
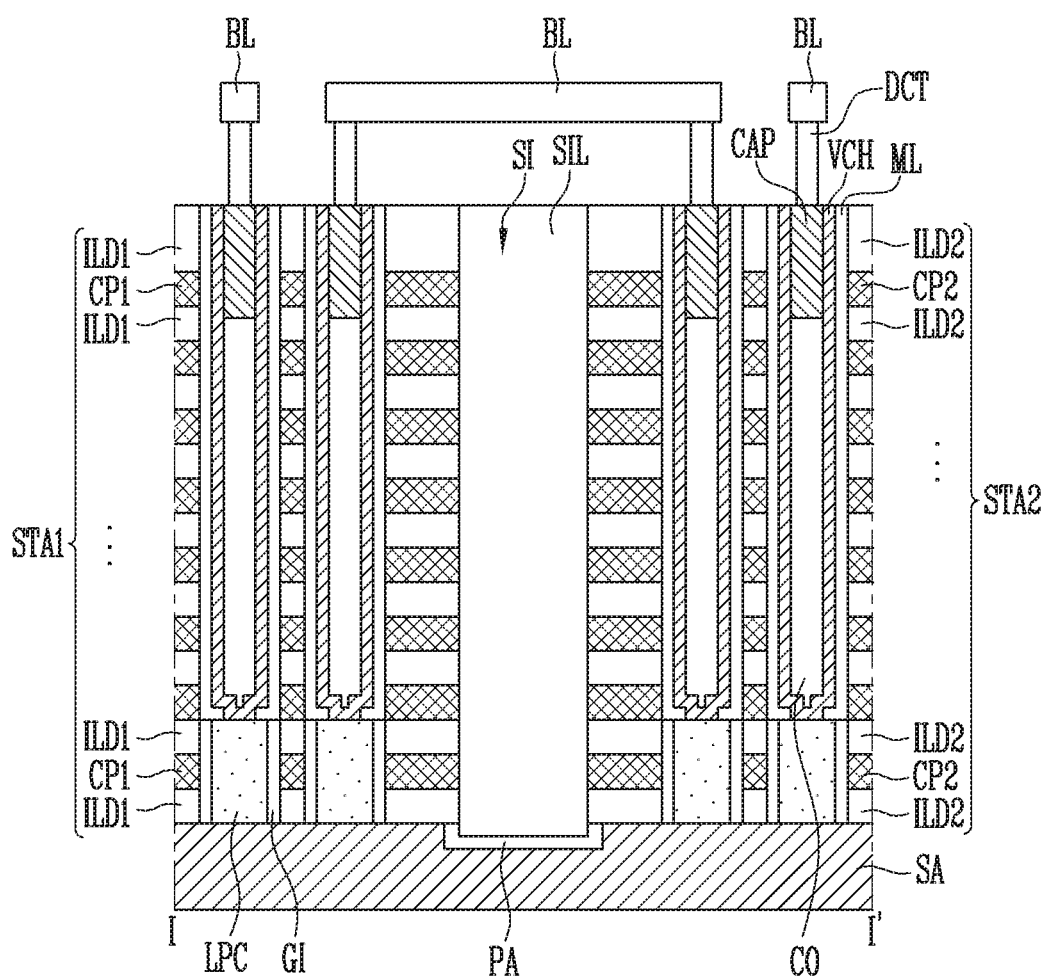

The first stack structure STA1 may be penetrated by vertical channels VCH11 and VCH12 shown in FIG. 3A, or be penetrated by vertical channels VCH shown in FIGS. 3B to 3D. The second stack structure STA2 may be penetrated by vertical channels VCH21 and VCH22 shown in FIG. 3A, or be penetrated by vertical channels VCH shown in FIGS. 3B to 3D.

The slit SI between the first stack structure STA1 and the second stack structure STA2 may be filled with a slit insulating layer SIL as shown in FIGS. 3A, 3B, and 3D, or be filled with a sidewall insulating layer SWI and a source contact structure SC as shown in FIG. 3C.

A protective layer PA may be formed on a surface of the lower structure PG or SA adjacent to a bottom surface of the slit SI. The protective layer PA may be an oxide layer.

A cell string of the three-dimensional semiconductor device may be implemented in various structures, using the first and second stack structures STA1 and STA2.

For example, referring to FIG. 3A, the lower structure may include a pipe gate PG. The pipe gate PG may be formed of various conductive materials. For example, the pipe gate PG may include doped silicon layers stacked as multiple layers.

The pipe gate PG extends to overlap with the slit SI and the slit insulating layer SIL. The protective layer PA may extend along an interface between the pipe gate PG and the slit insulating layer SIL.

A first channel layer CH1 includes first vertical channels VCH11 penetrating the first stack structure STA1, a second vertical channel VCH21 penetrating the second stack structure STA2, and a pipe channel PCH1 that connects the first and second vertical channels VCH11 and VCH21 and is disposed in the pipe gate PG. The pipe channel PCH1 of the first channel layer CH1 may extend in a horizontal direction. The first vertical channel VCH11 and the second vertical channel VCH21 of the first channel layer CH1 may extend to the inside of the pipe gate PG to connect to the pipe channel PCH1.

A second channel layer CH2 includes a first vertical channel VCH12 penetrating the first stack structure STA1, a second vertical channel VCH22 penetrating the second stack structure STA2, and a pipe channel PCH2 that connects the first and second vertical channels VCH12 and VCH22 and is disposed in the pipe gate PG. The pipe channel PCH2 of the second channel layer CH2 may extend in a horizontal direction. The first vertical channel VCH12 and the second vertical channel VCH22 of the second channel layer CH2 may extend to the inside of the pipe gate PG to be connected to the pipe channel PCH2.

The pipe channel PCH2 of the second channel layer CH2 is disposed higher than the pipe channel CH1 of the first channel layer CH1, and is formed shorter than the first channel layer CH1. Both ends of the pipe channel PCH1 of the first channel layer CH1 protrude further laterally (e.g., in the first direction X of FIG. 2) than both ends of the pipe channel PCH2 of the second channel layer CH2. The first vertical channel VCH12 and the second vertical channel VCH22 of the second channel layer CH2 are disposed between the first vertical channel VCH11 and the second vertical channel VCH21 of the first channel layer CH1.

Each of the first channel layer CH1 and the second channel layer CH2 may be formed as a semiconductor layer such as, for example, a silicon semiconductor layer. Outer walls of the first channel layer CH1 and the second channel layer CH2 may be surrounded by a first multi-layer ML1 and a second multi-layer ML2, respectively. The first multi-layer ML1 and the second multi-layer ML2 are configured identically to the multi-layer ML described in FIG. 1B. Core regions of the first channel layer CH1 and the second channel layer CH2 may be filled with a first core insulating layer CO1 and a second core insulating layer CO2, respectively. A doped semiconductor pattern CAP may be formed on the top of each of the first core insulating layer CO1 and the second core insulating layer CO2. For example, the doped semiconductor pattern CAP may be formed as a doped silicon layer. The doped semiconductor pattern CAP fills in the core region at both ends of the first channel layer CH1 or both ends of the second channel layer CH2.

FIG. 3A shows a perspective plan illustration A of a structure of the pipe channel PCH1 connected between the first vertical channel VCH11 and the second vertical channel VCH21 of the first channel layer CH1. The pipe channel PCH1 of the first channel layer CH1 and the pipe channel PCH2 of the second channel layer CH2 may be alternately disposed along the second direction Y shown in FIG. 2. The pipe channel PCH1 of the first channel layer CH1 and the pipe channel PCH2 of the second channel layer CH2 may be designed not to overlap with each other.

The doped semiconductor pattern CAP of the first stack structure STA1 may be connected to a bit line BL via a drain contact plug DCT. The doped semiconductor pattern CAP of the second stack structure STA2 may be connected to a common source line CSL. Although not shown in the drawing, a contact plug may be further formed between the doped semiconductor pattern CAP and the common source line CSL.

The first conductive patterns CP1 of the first stack structure STA1 shown in FIG. 3A may be used as word lines and a drain select line. An uppermost pattern among the first conductive patterns CP1 may be used as the drain select line, and some first conductive patterns under the drain select line may be used as the word lines described in FIG. 1A. The number of first conductive patterns CP1 used as the drain select line is not limited to one uppermost pattern, and the drain select line may further include one or more first conductive patterns disposed under the uppermost pattern.

The second conductive patterns CP2 of the second stack structure STA2 shown in FIG. 3A may be used as word lines and a source select line. An uppermost pattern among the second conductive patterns CP2 may be used as the source select line, and some second conductive patterns under the source select line may be used as the word lines described in FIG. 1A. The number of second conductive lines CP2 used as the source select line is not limited to one uppermost pattern, and the source select line may further include one or more second conductive patterns disposed under the uppermost pattern.

According to the above-described pattern, drain select transistors are defined at intersection portions of the first conductive pattern used as the drain select line and the vertical channels VCH11 and VCH12, and source select transistors are defined at intersection portions of the second conductive pattern used as the source select line and the vertical channels VCH21 and VCH22. In addition, memory cell transistors are defined at intersection portions of the first conductive patterns used as the word lines and the vertical channels VCH11 and VCH12 and intersection portions of the second conductive patterns used as the word lines and the vertical channels VCH21 and VCH22. In addition, pipe transistors are defined at an intersection portion of the pipe gate PG and the first channel layer CH1 and an intersection portion of the pipe gate PG and the second channel layer CH2. Accordingly, a U-shaped cell string is formed, which includes a drain select transistor, memory cell transistors, a pipe transistor, and a source select transistor, which are connected in series through the first channel layer CH1 or the second channel layer CH2, and is connected between the bit line BL and the common source line CSL.

In another example, referring to FIG. 3B, the lower structure under the first and second stack structures STA1 and STA2 may include a doped region SA defined by injecting a dopant of a conductivity type into a semiconductor substrate. The doped region SA may be used as a source layer. In an embodiment, the semiconductor substrate may be a silicon substrate. The protective layer PA may extend along an interface between the doped region SA and the slit insulating layer SIL.

The vertical channel VCH penetrating the first stack structure STA1 or the second stack structure STA2 is formed as a semiconductor layer. For example, the vertical channel VCH may be formed as a silicon layer. The vertical channel VCH may be in direct contact with the doped region SA. A sidewall of the vertical channel VCH may be surrounded by a multi-layer ML. The multi-layer ML is formed in the same structure as described in FIG. 1B. A core region of the vertical channel VCH may be filled with a core insulating layer CO and a doped semiconductor pattern CAP as described in FIG. 3A. The doped semiconductor pattern CAP may be connected to a bit line BL via a drain contact plug DCT.

The first conductive patterns CP1 of the first stack structure STA1 shown in FIG. 3B or the second conductive patterns CP2 of the second stack structure STA2 shown in FIG. 3B may be used as a source select line, word lines, and a drain select line. A lowermost pattern among the first conductive patterns CP1 or a lowermost pattern among the second conductive patterns CP2 may be used as the source select line, and an uppermost pattern among the first conductive patterns CP1 or an uppermost pattern among the second conductive patterns CP2 may be used as the drain select line. Some first conductive patterns between the source select line and the drain select line or some second conductive patterns between the source select line and the drain select line may be used as the word lines described in FIG. 1A. The conductive pattern used as the source select line in each of the first and second stack structures STA1 and STA2 is not limited to one lowermost pattern, and the source select line may further include one or more first conductive patterns or one or more second conductive patterns, which are disposed between the word lines and the lowermost pattern. The conductive pattern used as the drain select line in each of the first and second stack structures STA1 and STA2 is not limited to one uppermost pattern, and the drain select line may further include one or more first conductive patterns or one or more second conductive patterns, which are disposed between the word lines and the uppermost pattern.

According to the above-described structure, a drain select transistor is defined at an intersection portion of the conductive pattern used as the drain select line and the vertical channel VCH, and a source select transistor is defined at an intersection portion of the conductive pattern used as the source select line and the vertical channel VCH. In addition, memory cell transistors are defined at intersection portions of the conductive patterns used as the word lines between the drain select line and the source select line and the vertical channel VCH. Accordingly, a cell string is formed, which includes a drain select transistor, memory cell transistors, and a source select transistor, which are connected in series through the vertical channel VCH. The cell string is connected between the bit line BL and the doped region SA.

In still another example, referring to FIG. 3C, the usage of each of the first conductive patterns CP1 of the first stack structure STA1 and the second conductive patterns CP2 of the second stack structure STA2 may be the same as described in FIG. 3B. The structure of each of the vertical channel VCH, the core insulating layer CO, the doped semiconductor pattern CAP, the drain contact plug DCT, and the bit line BL is the same as described in FIG. 3B.

The lower structure under the first and second stack structures STA1 and STA2 may include a doped region SA. The doped region SA may be formed in a structure in which first to third doped semiconductor layers SA1 to SA3 are stacked (See FIG. 3C). The first to third doped semiconductor layers SA1 to SA3 may include dopants of different conductivity types, or include dopants of the same conductivity type. For example, each of the first to third doped semiconductor layers SA1 to SA3 may be formed as an n-type silicon layer including an n-type dopant. The third doped semiconductor layer SA3 disposed between the first doped semiconductor layer SA1 and the second doped semiconductor layer SA2 may be in direct contact with a sidewall of the vertical channel VCH.

The vertical channel VCH may penetrate the third doped semiconductor layer SA3 and the second doped semiconductor layer SA2, and extend to the inside of the first doped semiconductor layer SA1. A multi-layer having the structure described in FIG. 1B extends along an outer wall of the vertical channel VCH, and may be separated into an upper pattern MLa and a lower pattern MLb by the second doped semiconductor layer SA2.

The sidewall insulating layer SWI is formed on a sidewall of the slit SI. The slit SI and the sidewall insulating layer SWI may penetrate the third doped semiconductor layer SA3 and extend into the second doped semiconductor layer SA2. The protective layer PA may be penetrated by the source contact structure SC. The remaining protective layer PA may extend along an interface between the sidewall insulating layer SWI and the second doped semiconductor layer SA2.

In still another example, referring to FIG. 3D, the semiconductor device further includes a lower channel LPC disposed on the bottom of the vertical channel VCH. The lower channel LPC may be formed by using a growth method using an epitaxial process, etc., or may be formed by using a deposition method. The lower channel LPC penetrates a lower portion of each of the first and second stack structures STA1 and STA2 and is in direct contact with the doped region SA. The lower channel LPC is formed to a depth where it penetrates conductive patterns used as a source select line, and is used as a channel layer of a source select transistor. The lower channel LPC is formed with a height lower than that of each of the first and second stack structures STA1 and STA2. The lower channel LPC may be surrounded by a gate insulating layer GI. The lower channel LPC may be a doped silicon layer. The lower channel LPC silicon layer may be doped with any suitable impurity.

The vertical channel VCH penetrates, on the lower channel LPC, the first stack structure STA1 or the second stack structure STA2, which corresponds thereto. The vertical channel VCH extends to be in direct contact with the lower channel LPC. The vertical channel VCH is formed of the same material as described in FIG. 3B. The multi-layer ML extends along an interface between the vertical channel VCH and the first stack structure STA1 or an interface between the vertical channel VCH and the second stack structure STA2.

The doped region SA is formed of the same material as described in FIG. 3B. The structure and usage of each of the protective layer PA, the first conductive patterns CP1 of the first stack structure STA1, the second conductive patterns CP2 of the second stack structure STA2, the core insulating layer CO, the doped semiconductor pattern CAP, the bit line BL, and the drain contact plug DCT, which are shown in FIG. 3D, are the same as described in FIG. 3B.

The three-dimensional semiconductor devices including cell strings having the various structures described in FIGS. 3A to 3D may be formed using manufacturing methods which will be described later.

FIGS. 4A to 4F are sectional views illustrating a manufacturing method of a semiconductor device in accordance with an embodiment of the present disclosure. FIGS. 4A to 4F are sectional views taken along the line I-I' shown in FIG. 2.

Figure 4A:
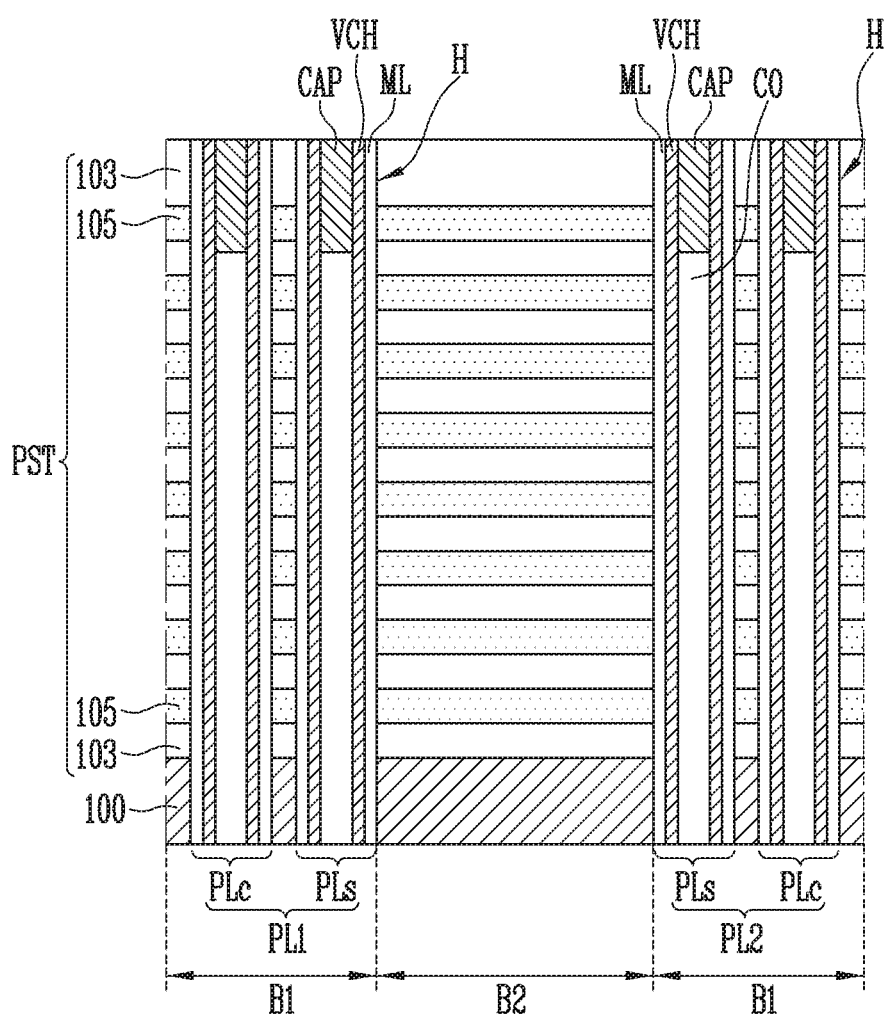

Referring to FIG. 4A, a stack structure PST is formed by alternately stacking interlayer insulating layers 103 and sacrificial insulating layers 105 on a lower structure 100. The stack structure PST may include first regions B1 and a second region B2. The second region B2 may be defined between two adjacent first regions B1. The lower structure 100 may be a conductive layer for the pipe gate PG described in FIG. 3A, a semiconductor substrate for the doped region SA described in FIGS. 3B and 3D, or a doped silicon layer for the doped region SA described in FIG. 3C.

The sacrificial insulating layers 105 are formed of a material different from that of the interlayer insulating layers 103. The interlayer insulating layers 103 may be formed of a silicon oxide layer as a material for insulating between conductive patterns. The sacrificial insulating layers 105 are formed of a material that may be selectively etched in subsequent etching processes of forming an opening between the interlayer insulating layers 103. The interlayer insulating layers 103 have an etching resistivity larger than that of the sacrificial insulating layers 105 with respect to etching materials for selectively removing the sacrificial insulating layers 105. The sacrificial insulating layers 105 may be formed of a silicon-based insulating material. For example, the sacrificial insulating layers 105 may be formed of a silicon nitride layer.

Subsequently, holes H are formed, which penetrate each of the first regions B1 of the stack structure PST. Subsequently, pillars PLc and PLs filling in the holes H are formed. The holes H and the pillars PLc and PLs extend along the stacked direction of the interlayer insulating layers 103 and the sacrificial insulating layers 105, and may extend to the inside of the lower structure 100 or penetrate the lower structure 100.

The pillars PLc and PLs may be divided into pillar groups PL1 and PL2 by the second region B2. Each of the pillar groups PL1 and PL2 may include a center pillar PLc and a slit-side pillar PLs, which penetrate the corresponding first region B1. The slit-side pillar PLs is a pillar adjacent to the second region B2, and the center pillar PLc is a pillar spaced apart from the second region B2 with the slit-side pillar PLs interposed therebetween.

Each of the pillars PLc and PLs may include a core insulating layer CO, a doped semiconductor pattern CAP disposed on the core insulating layer CO, a vertical channel VCH surrounding the structure in which the core insulating layer CO and the doped semiconductor pattern CAP are stacked, and a multi-layer ML surrounding the vertical channel VCH. The multi-layer ML may be formed according to the structure described in FIG. 1B.

Figure 4B:
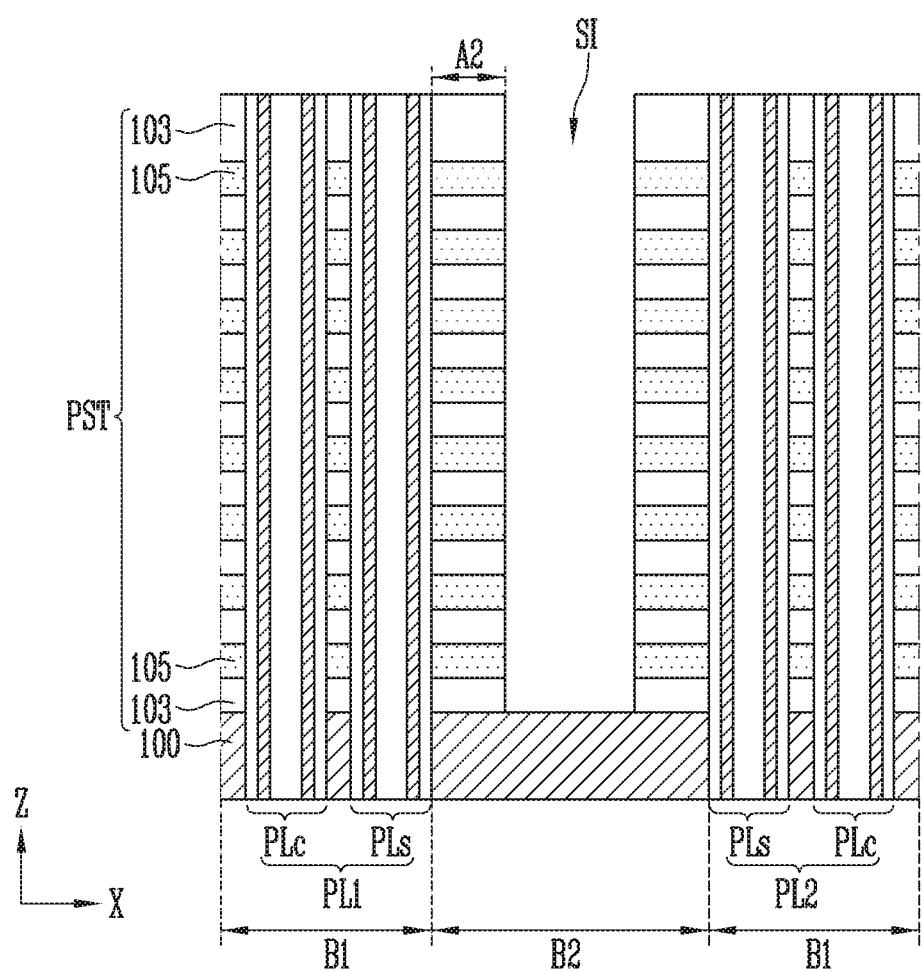

Referring to FIG. 4B, a slit SI penetrating the second region B2 is formed by etching the interlayer insulating layers 103 and the sacrificial insulating layers 105, which are formed in the second region B2 of the stack structure PST. The slit SI may be formed to a depth to expose the lower structure 100.

The first region B1 of the stack structure PST corresponds to the array region A1 described in FIG. 2, and a portion of the second region B2 of the stack structure PST, which remains between the slit-side pillars PLs and the slit SI, corresponds to the side region A2 described in FIG. 2.

On a plane (i.e., an XY plane) vertically intersecting a third direction Z shown in the drawing, the unit area of the stack structure PST is larger in the first region B1 than that in the side region A2. This is because the stack structure PST is penetrated by the pillars PLc and PLs in the first region B1, hence, the remaining amount of each of the sacrificial insulating layers 105 per unit area is larger in the side region A2 than that in the first region B1.

Referring to FIG. 4C, a protective layer 111 is formed by oxidizing the lower structure 100 which is exposed through the slit SI. The protective layer 111 is formed as an oxide layer, and prevents the lower structure 100 from being etched by a first etching material in a subsequent process.

Figure 4D:
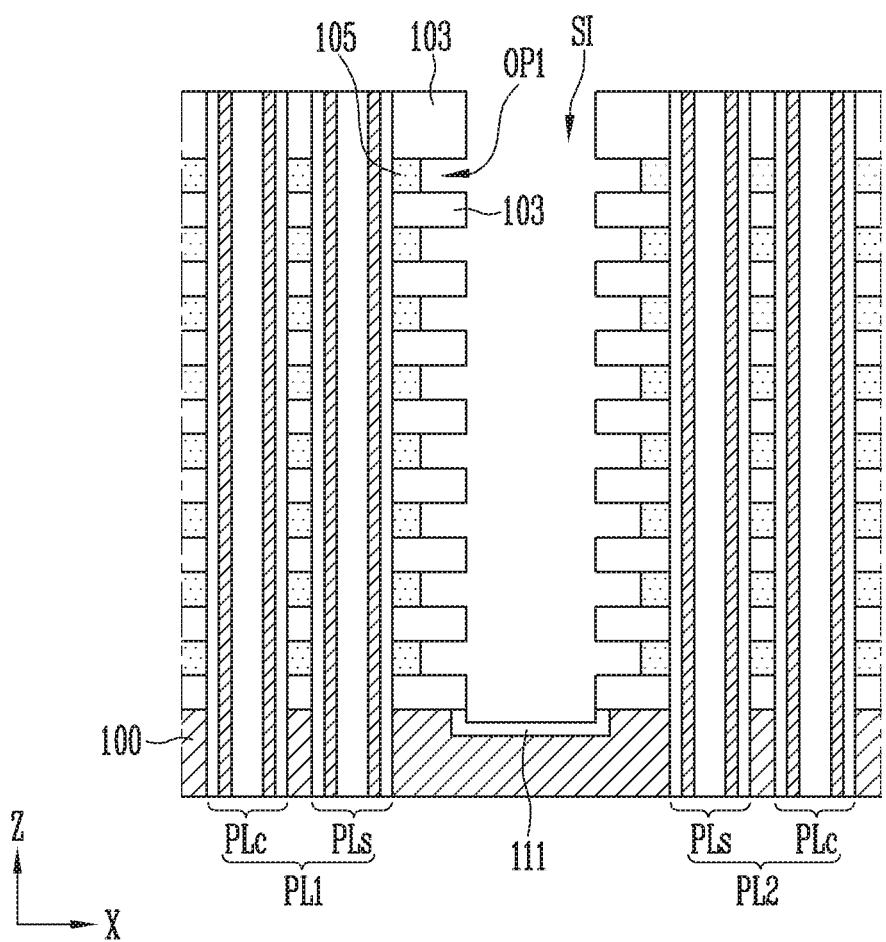

Referring to FIG. 4D, a portion of each of the sacrificial insulating layers 105, which remains between the slit SI and the slit-side pillar PLs, is removed through a first selective etching process. The first selective etching process may be performed by introducing a first etching material through the slit SI. First openings OP1 may be formed between adjacent interlayer insulating layers 103 in the stacked direction through the first selective etching process.

Figure 4E:
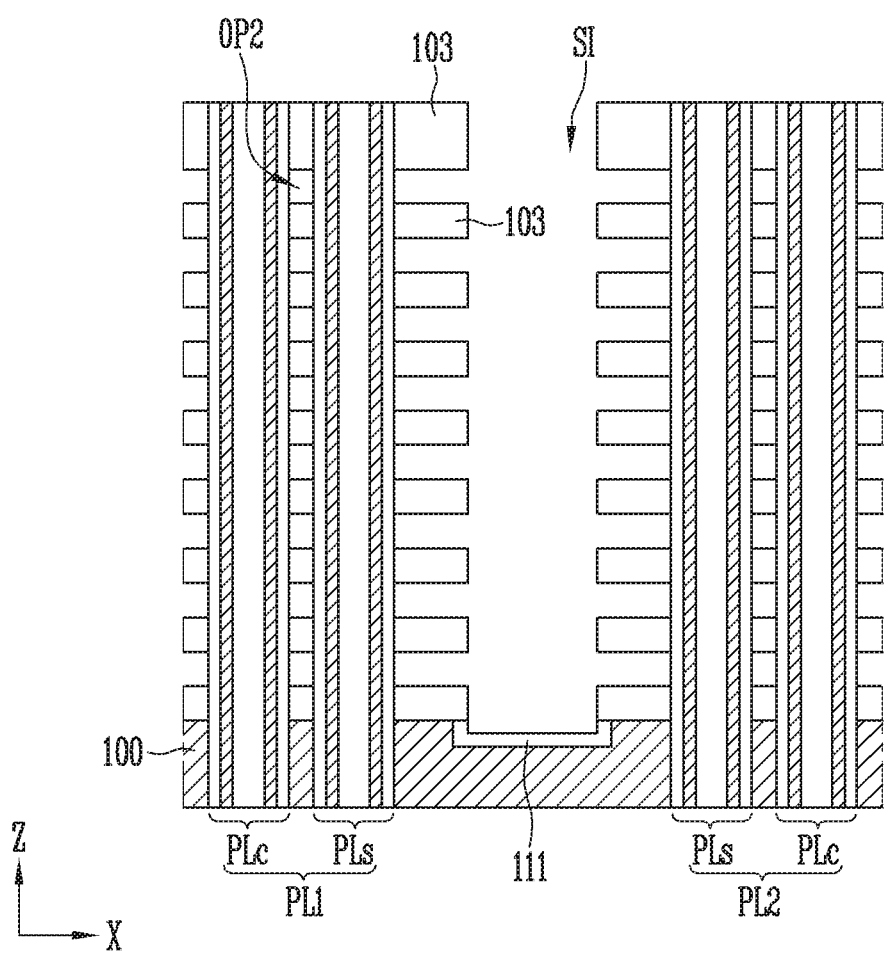

Referring to FIG. 4E, there is performed a second selective etching process of removing the sacrificial insulating layers remaining between the pillars PLs and PLc included in each of the pillar groups PL1 and PL2 by introducing a second etching material through the first openings OP1 shown in FIG. 4D. Second openings OP2 may be formed between the interlayer insulating layers 103 through the second selective etching process. The second etching material is different from the first etching material.

The first etching material and the second etching material, which are described in FIGS. 4D and 4E, are controlled to reduce the generation of a silicon by-product in the process of selectively removing the sacrificial insulating layers and reduce damage of an oxide layer such as a blocking insulating layer.

A wet etching method or a dry etching method may be used to selectively remove the silicon nitride layer constituting each of the sacrificial insulating layers. The first etching material is an etching material used in the dry etching method, and the second etching material is an etching material used in the wet etching method.

More specifically, the first etching material may include at least one of a gas in which nitrogen trifluoride ($NF_3$) and oxygen ($O_2$) are mixed, a gas in which hydrogen fluoride (HF) and oxygen ($O_2$) are mixed, and a chlorotrifluoride ($ClF_3$) gas. The first etching material is in a gaseous state. The first etching material has a first etching selection ratio at which it rapidly etches the silicon nitride layer constituting each of the sacrificial insulating layers, as compared with the silicon oxide layer constituting each of the interlayer insulating layers.

The second etching material is a solution including a phosphoric acid. The second etching material has a second etching selection ratio at which it rapidly etches the silicon nitride layer constituting each of the sacrificial insulating layers, as compared with the silicon oxide layer constituting each of the interlayer insulating layers.

The first etching selection ratio is lower than the second etching selection ratio. That is, a speed at which the sacrificial insulating layers are etched by using the wet etching method using the second etching material is faster than that at which the sacrificial insulating layers are etched by using the dry etching method using the first etching material. A silicon by-product dissolved from the silicon nitride layer may be generated in the process of performing wet etching using the second etching material. When dry etching is performed using the first etching material, the generation of the silicon by-product may be suppressed.

In an embodiment of the present disclosure, the first openings OP1 are formed as shown in FIG. 4D by removing only portions of the sacrificial insulating layers adjacent to the slit SI, using the first etching material. Subsequently, in an embodiment of the present disclosure, the second openings OP2 are formed as shown in FIG. 4E by removing remaining portions of the sacrificial insulating layers adjacent to the slit SI which were not removed with the first etching, and by removing the sacrificial insulating layers between the pillars PLs and PLc, using the second etching material. The etching method is designed by considering that, as described in FIG. 4B, the remaining amount of each of the sacrificial insulating layers per unit area is larger between the slit SI and the slit-side pillar PLs than that between the pillars PLc and PLs.

In an embodiment of the present disclosure, suppression of the silicon by-product generated from the sacrificial insulating layers is maximized. This is because the first selective etching using the first etching material capable of suppressing the generation of the silicon by-product is performed in the region where the sacrificial insulating layer is relatively larger. In addition, when a region in which the remaining amount of the sacrificial insulating layers is relatively small is removed using the second etching material, the speed at which the silicon by-product is generated and the amount of the generated silicon by-product may be decreased even though the silicon by-product is dissolved from the sacrificial insulating layers by the second etching material. The silicon by-product having the decreased speed and amount may be rapidly diffused using a chemical circulation system. Accordingly, the formation of an oxide layer due to the silicon by-product may be prevented. The oxide layer formed due to the silicon by-product may remain between the interlayer insulating layers 103 and hence interfere with the formation of conductive patterns in a subsequent process. Therefore, a failure may occur, such as deterioration of the operational reliability of memory cell transistors of the semiconductor device. In accordance with an embodiment of the present disclosure, the formation of the oxide layer due to the silicon by-product is prevented, so that a failure occurring in the semiconductor device due to the silicon by-product may be prevented.

Although the first etching selection ratio of the first etching material is lower than the second etching selection ratio of the second etching material, the first selective etching process using the first etching material is stopped before the pillars PLs and PLc are exposed, so that oxide layers such as blocking insulating layers included in the pillars PLs and PLc are prevented from being damaged by the first etching material.

Figure 4F:
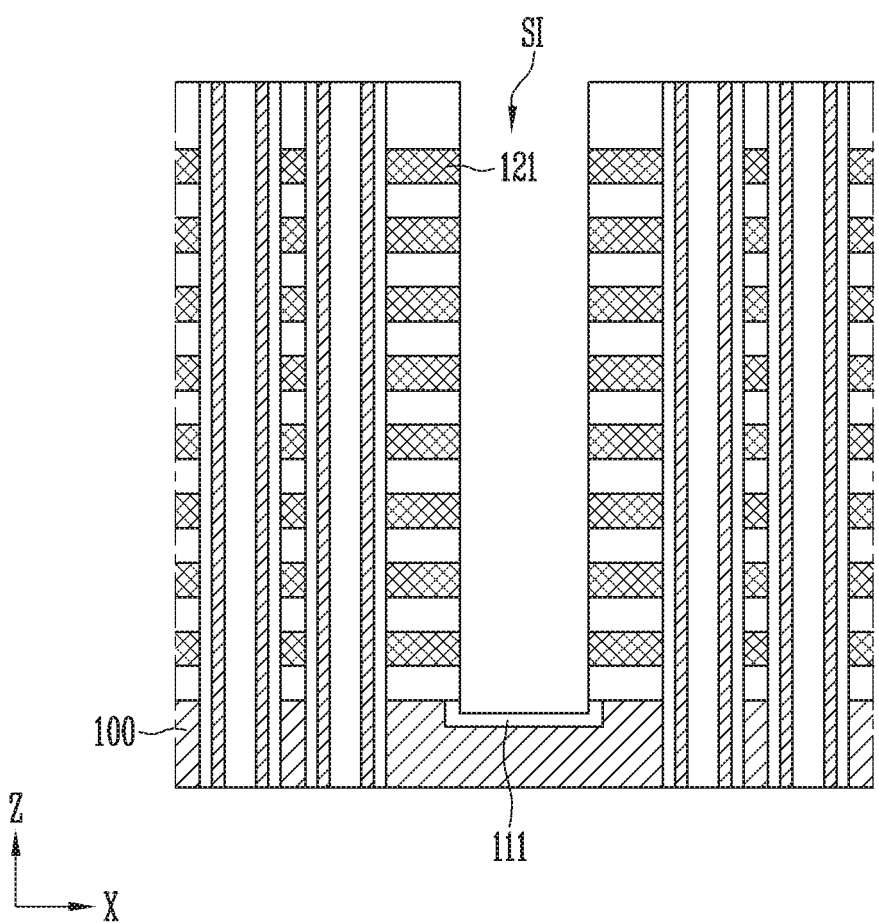

Referring to FIG. 4F, the first and second openings formed in the processes shown in FIGS. 4D and 4E are filled with conductive patterns 121. Each of the conductive patterns 121 may include at least one of a doped silicon layer, a metal silicide layer, and a metal layer. Each of the conductive patterns 121 may include a low-resistance metal such as tungsten to form low-resistance wiring. Each of the conductive patterns 121 may further include a barrier layer such as a titanium nitride layer, a tungsten nitride layer or a tantalum nitride layer.

Figure 5A:
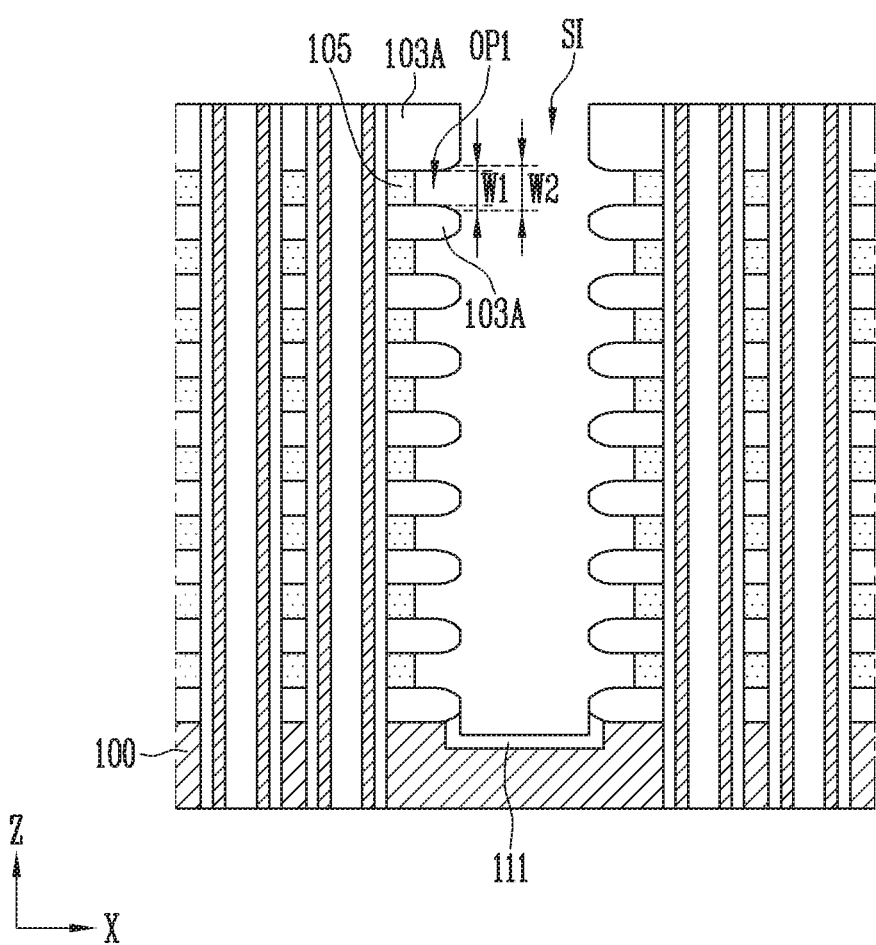
FIGS. 5A and 5B are sectional views illustrating a manufacturing method of a semiconductor device, in accordance with an embodiment of the present disclosure.
Figure 5B:
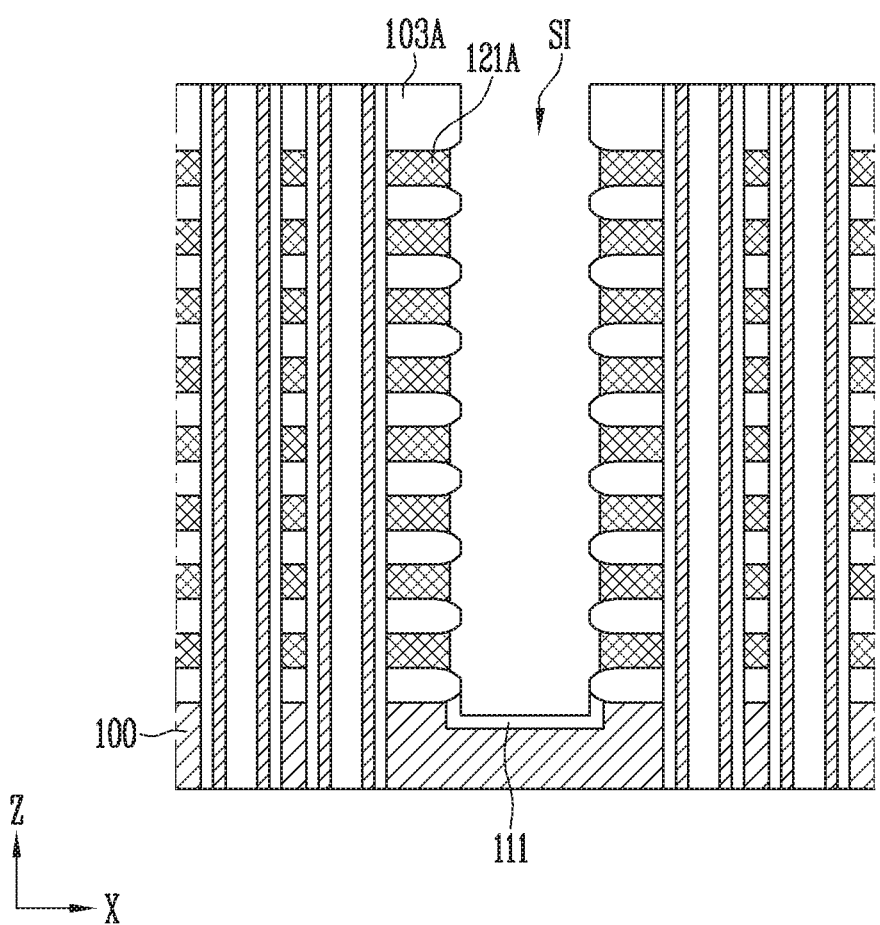

FIGS. 5A and 5B are sectional views illustrating a manufacturing method of a semiconductor device in accordance with an embodiment of the present disclosure. FIGS. 5A and 5B are sectional views taken along the line I-I' shown in FIG. 2. The manufacturing method in accordance with the embodiment of the present disclosure may further include a process of widening the width of a first opening OP1 adjacent to a slit SI before second openings are formed.

Referring to FIG. 5A, first openings OP1 may be formed by performing the same processes as described in FIGS. 4A to 4D. Subsequently, interlayer insulating layers 103A may be etched by controlling the etching rates of the interlayer insulating layers 103A and the sacrificial insulating layers 105 such that the width of each of the first openings OP1 increases in a direction toward the slit SI. More specifically, the composition of the first etching material may be changed such that the etching rate of the interlayer insulating layers 103A is higher than the first selective etching process. The lower structure 100 is protected by the protective layer 111 while the process of widening the width of the first openings OP1 is being performed.

After the width of the first openings OP1 is widened, a space defined between the interlayer insulating layers 103A may include a first width W1 and a second width W2. The first width W1 is defined as a distance between the interlayer insulating layers 103A spaced apart from each other with the sacrificial insulating layers 105 interposed therebetween. The second width W2 is defined as a distance between end portions of the interlayer insulating layers 103A, which are adjacent to the slit SI. The second width W2 is formed wider than the first width W1 by widening the width of the first openings OP1.

Referring to FIG. 5B, conductive patterns 121A are formed between the interlayer insulating layers 103A by performing the same processes as described in FIGS. 4E and 4F. Each of the conductive patterns 121A may be formed with a width that increases when approaching the slit SI.

Figure 6:
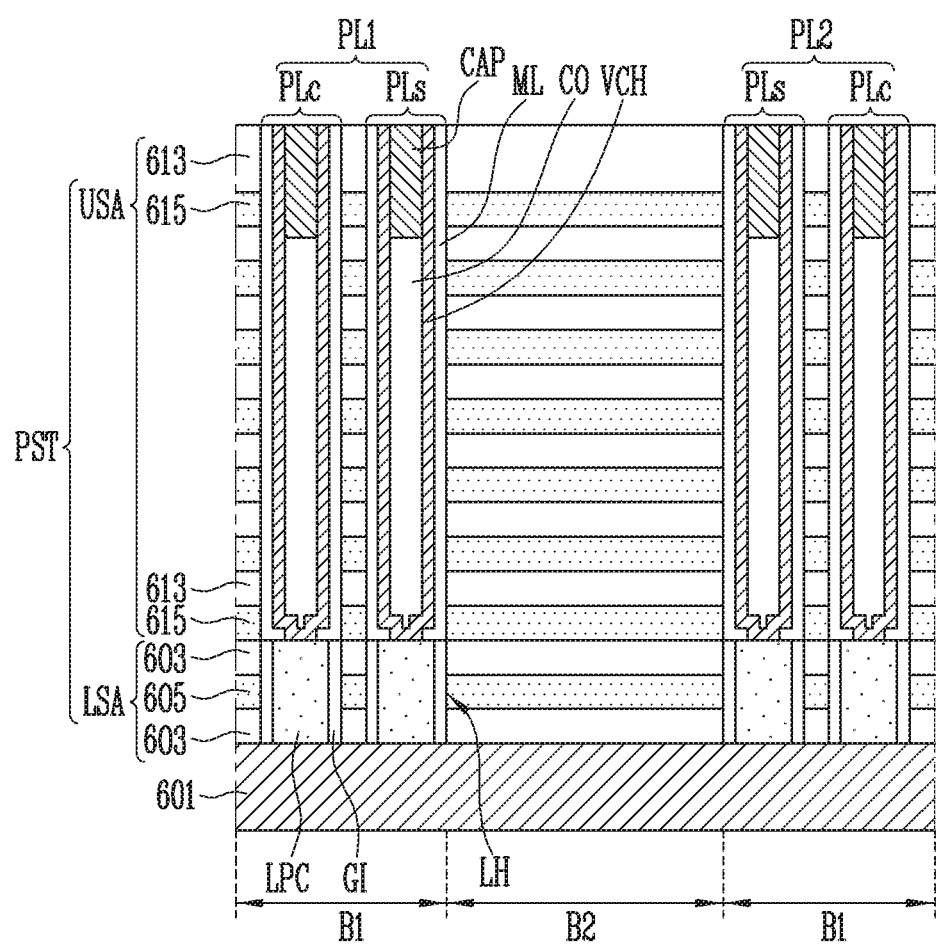
FIG. 6 is a sectional view illustrating a manufacturing method of a semiconductor device in accordance with an embodiment of the present disclosure.

FIG. 6 is a sectional view illustrating a manufacturing method of a semiconductor device in accordance with an embodiment of the present disclosure. FIG. 6 is a sectional view taken along the line I-I' shown in FIG. 2. The manufacturing method in accordance with an embodiment of the present disclosure may be used to manufacture the semiconductor device shown in FIG. 3D.

Referring to FIG. 6, a lower stack structure LSA is formed by stacking at least one pair of a lower interlayer insulating layer 603 and a lower sacrificial insulating layer 605. Subsequently, lower channels LPC are formed, which penetrate the lower stack structure LSA. Each lower channel LPC is surrounded by a gate insulating layer GI. The lower stack structure LSA includes first regions B1 and a second region B2 as described in FIG. 4A.

The process of forming the gate insulating layer GI and the lower channels LPC may include a process of forming lower holes LH that penetrate the first regions B1 of the lower stack structure LSA to expose the lower structure 601, a process of forming the gate insulating layer GI conformally on a sidewall of each of the lower holes LH, and a process of filling the lower holes LH with a semiconductor layer. Subsequently, a planarizing process may be further performed such that the semiconductor layer may remain as the lower channels LPC in only the lower holes LH. The semiconductor layer may be formed as a silicon layer. The semiconductor layer may, for example, be at least one of an undoped silicon layer and a doped silicon layer. An n-type dopant may be distributed in the doped silicon layer. The gate insulating layer GI may be formed of an insulating material such as, for example, a silicon oxide layer. The semiconductor layer may be formed using a deposition method, or be formed using a growth method such as an epitaxial method.

The lower structure 601 may be a doped silicon layer. When the lower channels LPC are formed using the growth method, the lower structure 601 may be used as a seed layer for the growth of the semiconductor layer.

Subsequently, an upper stack structure USA is formed by alternately stacking upper sacrificial insulating layers 615 and upper interlayer insulating layers 613 on the lower stack structure LSA penetrated by the lower channels LPC. Accordingly, a stack structure PST including the lower stack structure LSA and the upper stack structure USA is formed. The upper stack structure USA includes the first regions B1 and the second region as described in FIG. 4A.

The lower sacrificial insulating layers 605 may be formed of the same material as the upper sacrificial insulating layers 615, and the lower interlayer insulating layers 603 may be formed of the same material as the upper interlayer insulating layers 613.

The lower sacrificial insulating layers 605 and the upper sacrificial insulating layers 615 are formed of the same material as the sacrificial insulating layers 105 shown in FIG. 4A, and the lower interlayer insulating layers 603 and the upper interlayer insulating layers 613 are formed of the same material as the interlayer insulating layers 103 shown in FIG. 4A.

Subsequently, vertical channels VCH are formed, which penetrate the upper stack structure USA and be surrounded by a multi-layer ML. A central region of each of the vertical channels VCH may be filled with a core insulating layer CO and a doped semiconductor pattern CAP. The vertical channels VCH are formed to be in contact with the lower channels LPC.

Pillars PLc and PLs penetrating each of the first regions B1 of the stack structure PST are formed through the above-described process. Each of the pillars PLc and PLs includes a pair of a vertical channel VCH and a lower channel LPC, which are connected to each other. The pillars PLc and PLs are divided into pillar groups PL1 and PL2 as described in FIG. 4A, and each of the pillar groups PL1 and PL2 includes a center pillar PLc and a slit-side pillar PLs.

Subsequent processes continued to the above-described processes may be the same processes as described in FIGS. 4B to 4F.

Figure 7:
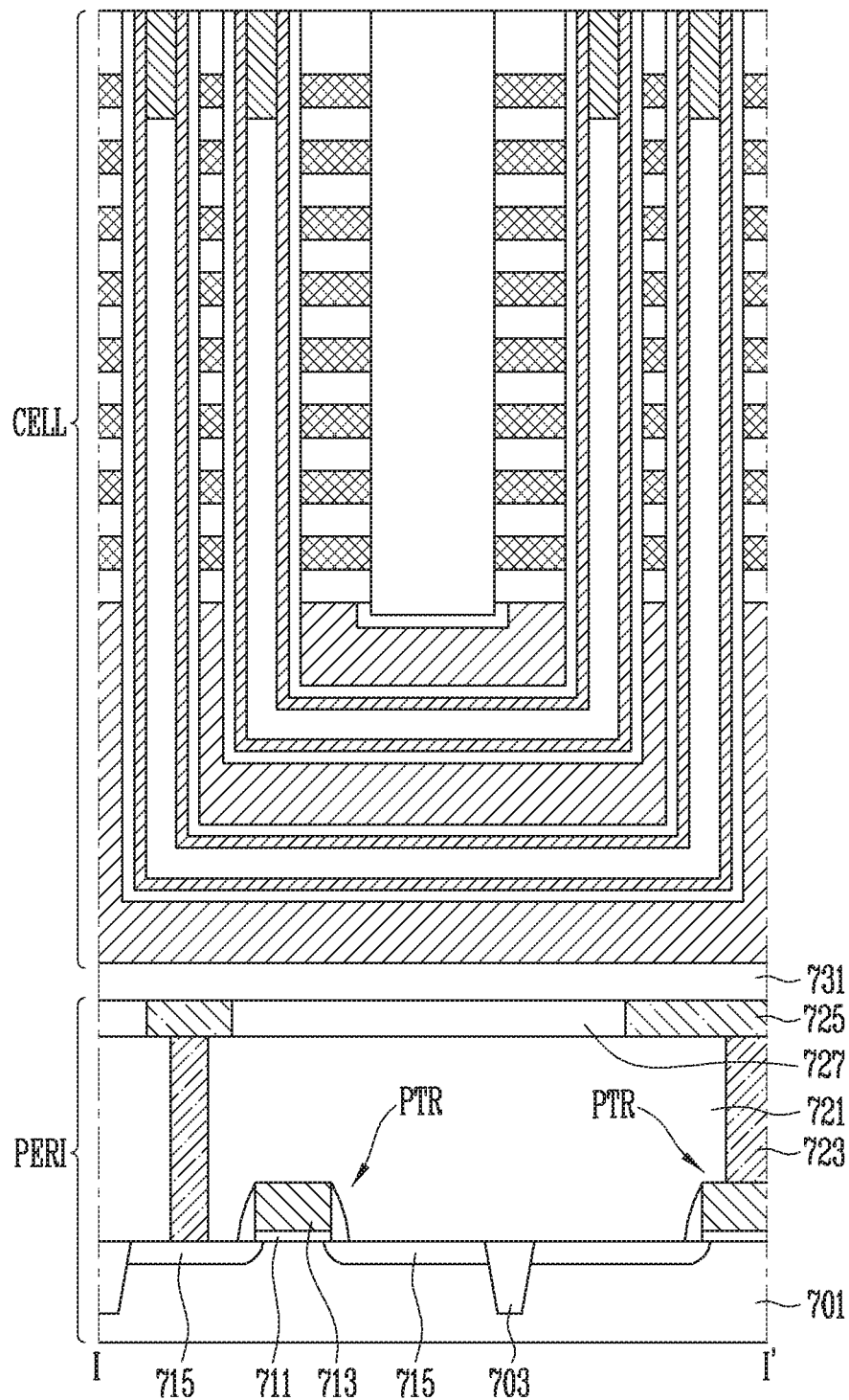
FIG. 7 is a sectional view illustrating a three-dimensional semiconductor device in accordance with an embodiment of the present disclosure.

FIG. 7 is a sectional view illustrating a three-dimensional semiconductor device in accordance with another embodiment of the present disclosure.

Referring to FIG. 7, the three-dimensional semiconductor device may include a cell region CELL and a peripheral circuit region PERI. The cell region CELL and the peripheral circuit region PERI may be stacked on a semiconductor substrate 701 to overlap with each other. An insulating layer 731 may be disposed between the cell region CELL and the peripheral circuit region PERI. The insulating layer 731 may be penetrated by a conductive pattern in a region that is not shown in the drawing.

At least one of the cell strings shown in FIGS. 3A to 3D is disposed in the cell region CELL. Although FIG. 7 illustrates the cell strings shown in FIG. 3A, the present disclosure is not limited thereto.

The peripheral circuit region PERI is a region in which a driving circuit for driving the cell strings is disposed. The driving circuit may include a plurality of driving transistors PTR and various types of conductive patterns 727 and 723 connected to the driving transistors PTR. The conductive patterns 727 and 723 may be insulated from each other by insulating layers 721 and 725.

The driving transistors PRT may be insulated from each other by a separation layer 703 formed in the semiconductor substrate 701. Each of the driving transistors PTR may include a gate insulating layer 711 formed on the semiconductor substrate 701, a gate pattern 713 formed on the gate insulating layer 711, and doping regions 715 formed in the semiconductor substrate 701 at both sides of the gate pattern 713. The doping regions 715 are used as source and drain regions.

The manufacturing processes in accordance with various embodiments of the present disclosure may be performed after the insulating layer 731 is formed on the peripheral circuit region PERI shown in FIG. 7.

Figure 8:
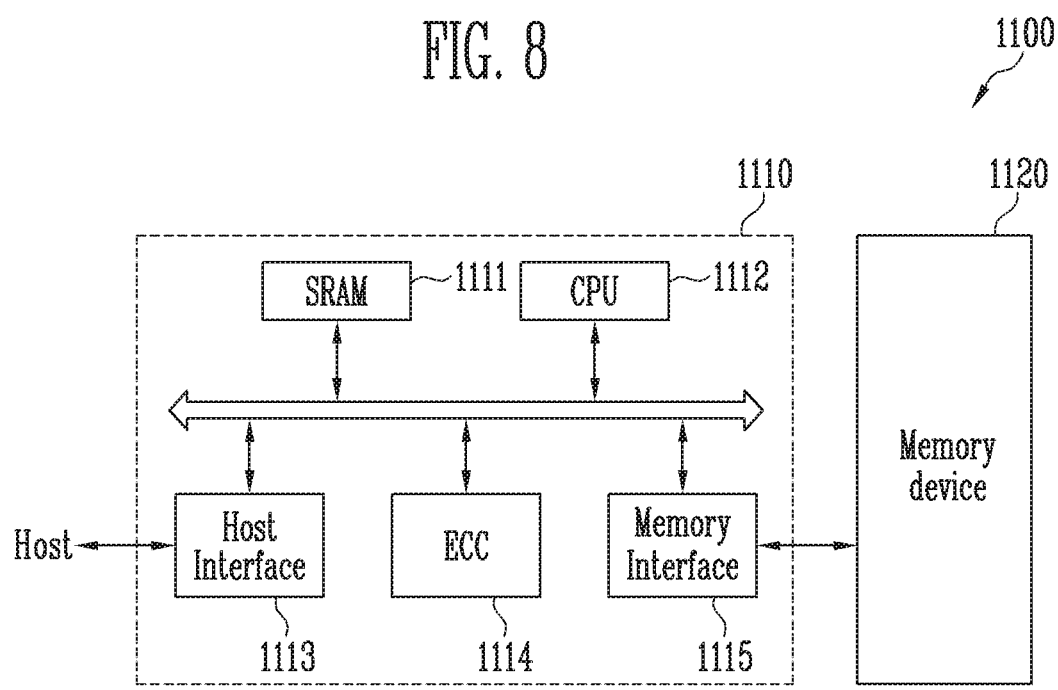
FIG. 8 is a block diagram illustrating a configuration of a memory system in accordance with an embodiment of the present disclosure.

FIG. 8 is a block diagram illustrating a configuration of a memory system in accordance with an embodiment of the present disclosure.

Referring to FIG. 8, the memory system 1100 in accordance with the embodiment of the present disclosure includes a memory device 1120 and a memory controller 1110.

The memory device 1120 may be a multi-chip package configured with a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 9:
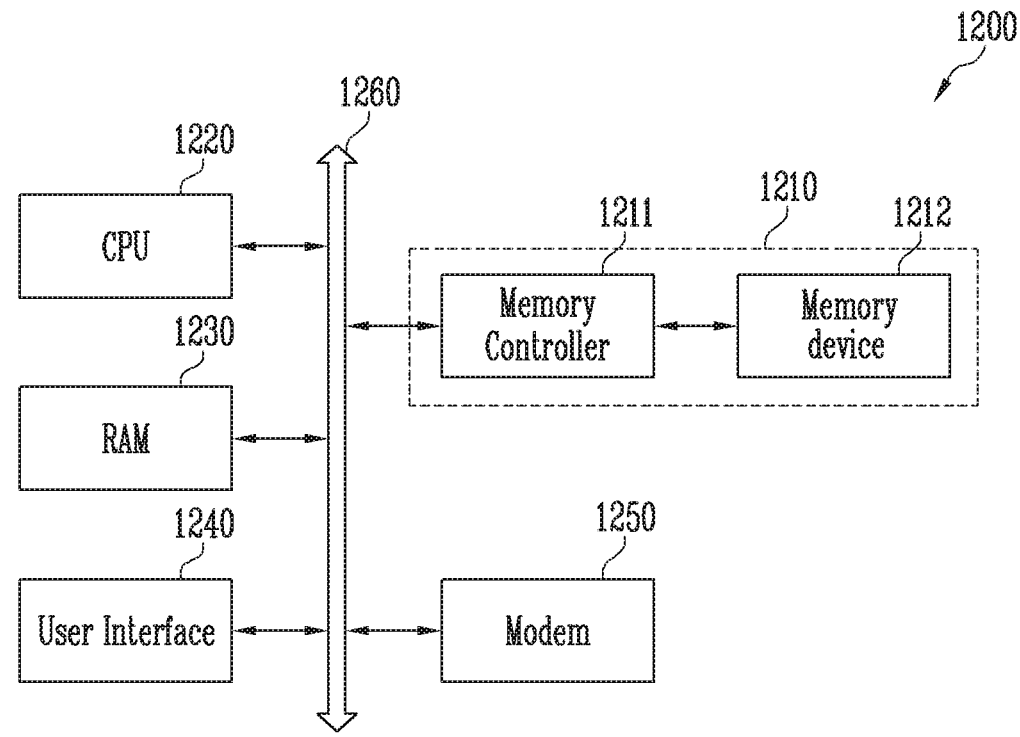
FIG. 9 is a block diagram illustrating a configuration of a computing system in accordance with an embodiment of the present disclosure.

FIG. 9 is a block diagram illustrating a configuration of a computing system in accordance with an embodiment of the present disclosure.

Referring to FIG. 9, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211.

In accordance with the present disclosure, the failure rate of the three-dimensional semiconductor device may be decreased by controlling the etching materials used in the process of removing the sacrificial insulating layer between the interlayer insulating layers.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

What is claimed is:

1. A method of manufacturing a semiconductor device, the method comprising:
    forming a stack structure including a first region and a second region by alternately stacking interlayer insulating layers and sacrificial insulating layers on a lower structure;
    forming pillars penetrating the first region of the stack structure;
    forming a slit penetrating the second region of the stack structure;
    forming first openings between the interlayer insulating layers by removing only a portion of each of the sacrificial insulating layers remaining between a slit-side pillar adjacent to the slit among the pillars and the slit, wherein the forming of the first openings is performed through dry etching using a first etching material introduced through the slit; and
    forming second openings between the interlayer insulating layers by removing remaining portions of the sacrificial insulating layers which were not removed while forming the first openings between the interlayer insulating layers, wherein the forming of the second openings is performed through wet etching using a second etching material introduced through the first openings.

2. The method of claim 1, further comprising filling the first and second openings with conductive patterns.

3. The method of claim 1, wherein the first etching material has a first etching selection ratio at which it rapidly etches the sacrificial insulating layers as compared with the interlayer insulating layers, and
    the second etching material has a second etching selection ratio at which it rapidly etches the sacrificial insulating layers as compared with the interlayer insulating layers,
    wherein the first etching selection ratio is lower than the second etching selection ratio.

4. The method of claim 1, wherein the first etching material is in a gaseous state, and
    the second etching material is in a soluble state.

5. The method of claim 1, wherein the first etching material includes at least one of a gas in which nitrogen trifluoride ($NF_3$) and oxygen ($O_2$) are mixed, a gas in which hydrogen fluoride (HF) and oxygen ($O_2$) are mixed, and a chlorotrifluoride ($ClF_3$) gas.

6. The method of claim 1, wherein the second etching material includes a phosphoric acid.

7. The method of claim 1, wherein the width of each of the first openings in the direction in which the interlayer insulating layers and the sacrificial insulating layers are stacked increases when approaching the slit.

8. The method of claim 1, wherein the lower structure includes a semiconductor substrate, a conductive layer or a doped silicon layer.

9. The method of claim 1, further comprising, before the first etching material is introduced, forming a protective layer by oxidizing the lower structure exposed through the slit.

10. The method of claim 1, wherein each of the pillars includes:
    a vertical channel extending in the direction in which the interlayer insulating layers and the sacrificial insulating layers are stacked;

a tunnel insulating layer surrounding the vertical channel;
a data storage layer surrounding the tunnel insulating layer; and
a blocking insulating layer surrounding the data storage layer.

11. A method of manufacturing a semiconductor device, the method comprising:
forming a stack structure by alternately stacking interlayer insulating layers and sacrificial insulating layers on a lower structure, the stack structure including first regions spaced apart from one another and a second region disposed between the first regions;
forming holes penetrating each of the first regions of the stack structure;
forming pillars filling in the holes, the pillars being divided into first and second pillar groups by the second region, each of the first and second pillar groups including a center pillar and a slit-side pillar;
forming a slit penetrating the second region to a depth to expose the lower structure;
forming a protective layer on the lower structure which is exposed through the slit;
removing only a portion of each of the sacrificial insulating layers which remains between the slit and the slit-side pillar through a first selective etching process by introducing a first etching material through the slit to form first openings between adjacent interlayer insulating layers; and
performing a second selective etching process using a second etching material that is different from the first etching material for removing remaining portions of the sacrificial insulating layers adjacent to the slit which were not removed with the first selective etching process, and the sacrificial insulating layers between the pillars.

12. The method of claim 11, wherein the first etching material includes at least one of a gas in which nitrogen trifluoride ($NF_3$) and oxygen ($O_2$) are mixed, a gas in which hydrogen fluoride (HF) and oxygen ($O_2$) are mixed, and a chlorotrifluoride ($ClF_3$) gas, and
wherein the second etching material is a solution including a phosphoric acid.

13. The method of claim 11, further comprising filling the first and second openings with conductive patterns.

14. The method of claim 11, wherein the first etching material has a first etching selection ratio at which it rapidly etches the sacrificial insulating layers as compared with the interlayer insulating layers, and
the second etching material has a second etching selection ratio at which it rapidly etches the sacrificial insulating layers as compared with the interlayer insulating layers,
wherein the first etching selection ratio is lower than the second etching selection ratio.

15. The method of claim 11, wherein the first selective etching process is performed through dry etching using the first etching material in a gaseous state, and
the second selective etching process is performed through wet etching using the second etching material in a soluble state.

16. The method of claim 11, wherein the width of each of the first openings in the direction in which the interlayer insulating layers and the sacrificial insulating layers are stacked increases in a direction approaching the slit.

17. The method of claim 11, wherein the lower structure includes a semiconductor substrate, a conductive layer or a doped silicon layer.

18. The method of claim 11, wherein the protective layer is formed by oxidizing the lower structure exposed through the slit.

19. The method of claim 11, wherein each of the pillars includes:
a vertical channel extending in the direction in which the interlayer insulating layers and the sacrificial insulating layers are stacked;
a tunnel insulating layer surrounding the vertical channel;
a data storage layer surrounding the tunnel insulating layer; and
a blocking insulating layer surrounding the data storage layer.

* * * * *